United States Patent
Bourdi et al.

(10) Patent No.: US 9,231,606 B2
(45) Date of Patent: *Jan. 5, 2016

(54) DITHER-LESS ERROR FEEDBACK FRACTIONAL-N FREQUENCY SYNTHESIZER SYSTEMS AND METHODS

(71) Applicant: Skyworks Solutions, Inc., Woburn, MA (US)

(72) Inventors: Tom Taoufik Bourdi, Irvine, CA (US); Thomas Obkircher, Santa Ana, CA (US); Bipul Agarwal, Irvine, CA (US); Chandra Mohan, Tustin, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/326,822

(22) Filed: Jul. 9, 2014

(65) Prior Publication Data

US 2015/0055738 A1 Feb. 26, 2015

Related U.S. Application Data

(60) Provisional application No. 61/867,759, filed on Aug. 20, 2013.

(51) Int. Cl.
| | |
|---|---|
| H03L 7/197 | (2006.01) |
| H03M 3/00 | (2006.01) |
| H04L 27/00 | (2006.01) |
| H03M 7/30 | (2006.01) |
| H04L 27/36 | (2006.01) |

(52) U.S. Cl.
CPC ............ *H03L 7/1978* (2013.01); *H03M 3/436* (2013.01); *H03M 7/3022* (2013.01); *H04L 27/00* (2013.01); *H04L 27/361* (2013.01)

(58) Field of Classification Search
CPC ......... H03L 7/07; H03L 7/08; H03L 2207/50; H02M 3/30; H02M 3/02; H02M 3/04; H02M 3/39; H02M 3/372; H04B 1/06
See application file for complete search history.

(56) References Cited

U.S. PATENT DOCUMENTS

| | | | | |
|---|---|---|---|---|
| 5,548,286 | A | * | 8/1996 | Craven ........................ 341/126 |
| 5,986,512 | A | * | 11/1999 | Eriksson ....................... 331/16 |
| 6,023,184 | A | * | 2/2000 | Little .......................... 327/336 |
| 6,657,566 | B1 | * | 12/2003 | Risbo et al. .................... 341/53 |
| 7,460,046 | B2 | | 12/2008 | Di Giandomenico et al. |

(Continued)

FOREIGN PATENT DOCUMENTS

| | | |
|---|---|---|
| WO | WO 2006-004893 A1 | 1/2006 |
| WO | WO 2008-041216 A1 | 4/2008 |

OTHER PUBLICATIONS

International Search Report and Written Opinion received in International Application No. PCT/US2014/047869, mailed Nov. 5, 2014, in 24 pages.

*Primary Examiner* — Jean B Corrielus
(74) *Attorney, Agent, or Firm* — Knobbe Martens Olson & Bear LLP

(57) ABSTRACT

A fractional-N divider of a frequency synthesizer is driven by a dither-less error feedback modulator to alleviate fractional spurious tones introduced by the cyclic train of division ratios from delta-sigma modulators. A first feedback loop generates the feedback signal. A second feedback loop disrupts fractional spurious tones and a third feedback loop provides approximately zero static error.

22 Claims, 14 Drawing Sheets

(56) References Cited

U.S. PATENT DOCUMENTS

| | | |
|---|---|---|
| 7,554,391 B1 * | 6/2009 | Zuiss et al. .................. 330/10 |
| RE41,518 E * | 8/2010 | Xu .............................. 341/143 |
| 7,961,129 B2 | 6/2011 | Ceballos et al. |
| 2002/0121994 A1 | 9/2002 | Bolton, Jr. |
| 2005/0001751 A1 * | 1/2005 | Inukai et al. ................. 341/143 |
| 2008/0150776 A1 * | 6/2008 | DiGiandomenico et al. . 341/143 |
| 2008/0297385 A1 * | 12/2008 | Clara et al. .................... 341/143 |
| 2011/0188551 A1 | 8/2011 | Shin et al. |
| 2013/0099839 A1 | 4/2013 | Kao et al. |
| 2014/0167995 A1 * | 6/2014 | Tiew et al. ................... 341/143 |

* cited by examiner

DITHER-LESS ERROR FEEDBACK FRACTIONAL-N FREQUENCY SYNTHESIZER SYSTEMS AND METHODS

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Fractional-N frequency synthesizers are essential parts of any modern multi-band and multi-standard wireless transceiver systems. These synthesizers make use of digital delta-sigma noise shaping modulators to generate the fractional division ratios. Delta-sigma modulators, however, comprise a finite state machine that generates cyclic train of division ratios. These introduce fractional spurious tones. In general, dithering and or seeding are used to alleviate the presence of delta-sigma fractional spurs. In high performance application, however, dither and seeding techniques are not useful since they significantly increase in-band noise and introduce large frequency errors.

SUMMARY

Embodiments reduce or eliminate fractional spurious tones present in delta-sigma based fractional-N frequency synthesizers without the use of dither or seeding in the modulator. In certain embodiments, the Fractional-N divider of the frequency synthesizer is driven by dither-less and seed-less modulators. In one embodiment, the dither-less and seed-less modulator comprises a Dither-Less Error Feedback Modulator (DS-EFM) and an exemplary $3^{rd}$ order Dither-Less Error Feedback Modulator (DS-EFM3) is provided. In another embodiment, the dither-less and seed-less modulator comprises a Dither-less Seed-less MASH architecture modulator (DS-MASH) and an exemplary three $1^{st}$ order stage Dither-less Seed-less MASH Modulator (DS-MASH111) is provided. In other embodiments, these modulators can be of any order and are not limited to $1^{st}$ order or $3^{rd}$ order modulators. Further embodiments comprise modifications to implement approximately static zero error over time.

In an embodiment, a phase-locked loop (PPL) circuit is disclosed. The PLL circuit comprises a phase frequency detector (PFD) configured to generate a first signal representative of a phase difference between a reference signal and a PLL feedback signal, an adjustment circuit in communication with the PDF and configured to generate a control voltage based on the first signal, a voltage-controlled oscillator (VCO) in communication with the adjustment circuit and configured to generate an output signal based on the control voltage, and a PLL feedback circuit in communication with the VCO and the PFD and configured to generate the PLL feedback signal based on the output signal.

The PLL feedback circuit includes a divider circuit configured to receive the output signal and to generate an updated version of the PLL feedback signal, and a dither-less delta-sigma modulator in communication with the divider circuit that allows the output signal to have an output frequency that is a non-integer multiple of the frequency of the reference signal. The dither-less delta-sigma modulator receives the output of the divider circuit and generates a cyclic code sequence which is feedback to the divider circuit. The dither-less delta-sigma modulator includes a first summing circuit configured to receive the output of the divider circuit and a modulator feedback signal and to provide a first summed signal, a quantizing circuit configured to receive the first summed signal and generate the cyclic code sequence, a first modulator feedback loop that generates the modulator feedback signal and includes a second summing circuit and a first filter. The second summing circuit is configured to receive the first summed signal and the cyclic code sequence and to provide a second summed signal, and the first filter is configured to filter the second summed signal and to provide the modulator feedback signal.

The dither-less delta-sigma modulator further includes a second modulator feedback loop that introduces a scaled version of the cyclic code sequence into the first feedback loop and includes a gain component configured to receive the cyclic code sequence and to provide a scaled code sequence. The second summing circuit is further configured to receive the scaled code sequence to introduce a small amount of error to the modulator feedback signal such that fractional spurious tones are disrupted.

The dither-less delta-sigma modulator further includes a third modulator feedback loop that periodically cancels the gain from the scaled code sequence in the second feedback loop and includes a filter configured to receive the scaled code sequence and to provide a filtered gain signal. The second summing circuit is further configured to receive the filtered gain signal to average error in the modulator feedback signal to approximately zero such that the dither-less delta-sigma modulator provides approximately zero static error. In an embodiment, one or more of the first and second filters comprises a delay.

In another embodiment, a dither-less delta-sigma modulator comprises a first summing circuit configured to combine an output of a divider circuit and a modulator feedback signal to provide a first summed signal, a quantizing circuit configured to generate a cyclic code sequence based on the first summed signal, a first modulator feedback loop including a second summing circuit configured to combine the first summed signal and the cyclic code sequence to provide a second summed signal, and a first filter configured to filter the second summed signal to provide the modulator feedback signal, and a second modulator feedback loop including a gain component configured to receive the cyclic code sequence and to provide a scaled code sequence based on the cyclic code sequence, where the second summing circuit is further configured to receive the scaled code sequence and combine the scaled code sequence and the second summed signal. The dither-less delta-sigma modulator further comprises a third modulator feedback loop that periodically cancels gain from the scaled code sequence in the second feedback loop and includes a filter configured to filter the scaled code sequence and to provide a filtered gain signal based on the scaled code sequence, the second summing circuit further configured to receive the filtered gain signal in order to average error in the modulator feedback signal so that the dither-less delta-sigma modulator provides approximately zero static error.

In a further embodiment, a phase-locked loop (PPL) circuit comprises a phase frequency detector (PFD) configured to generate a first signal representative of a phase difference between a reference signal and a PLL feedback signal, an adjustment circuit in communication with the PFD and configured to generate a control voltage based on the first signal, and a voltage-controlled oscillator (VCO) in communication with the adjustment circuit and configured to generate an output signal based on the control voltage, and a divider circuit configured to receive the output signal and to generate an updated version of the PLL feedback signal. The PLL circuit further comprises dither-less delta-sigma modulator in communication with the divider circuit and including a first summing circuit configured to combine the output of the divider circuit and a modulator feedback signal to provide a first summed signal, a quantizing circuit configured to quantize the first summed signal to generate a cyclic code sequence, a second summing circuit configured to combine the first summed signal and the cyclic code sequence to provide a second summed signal, a first filter configured to filter the second summed signal to provide the modulator feedback signal, and a gain component configured to receive the cyclic code sequence to provide a scaled code sequence, where the second summing circuit further configured to receive the scaled code sequence and combine the scaled code sequence with the first summed signal and the cyclic code sequence to provide the second summed signal. The dither-less delta-sigma modulator further includes a filter configured to filter the scaled code sequence and to provide a filtered gain signal based on the scaled code sequence, the second summing circuit further configured to combine the filtered gain signal with the scaled code sequence, the first summed signal, and the cyclic code sequence to provide the second summed signal. The dither-less delta-sigma modulator further includes a first modulator feedback loop that generates the modulator feedback signal and that includes the second summing circuit and the first filter, a second modulator feedback loop that introduces a scaled version of the cyclic code sequence into the first feedback loop and that includes the gain component, and a third modulator feedback loop that periodically cancels the gain from the scaled code sequence in the second feedback loop and that includes a filter configured to receive the scaled code sequence and to provide a filtered gain signal based on the scaled code sequence, the second summing circuit further configured to receive the filtered gain signal in order to average error in the modulator feedback signal so that the dither-less delta-sigma modulator provides approximately zero static error.

In a yet further embodiment, a wireless device comprises an antenna configured to facilitate reception of a radio frequency (RF) signal, a receiver in communication with the antenna, the receiver configured to process the RF signal, and a frequency synthesizer in communication with the receiver, the frequency synthesizer circuit having a phase-locked loop (PLL) circuit having a divider circuit and a dither-less delta-sigma modulator including a first summing circuit configured to combine an output of the divider circuit and a modulator feedback signal to provide a first summed signal, a quantizing circuit configured to quantize the first summed signal to generate a cyclic code sequence, a second summing circuit configured to combine the first summed signal and the cyclic code sequence to provide a second summed signal, a first filter configured to filter the second summed signal to provide the modulator feedback signal, a gain component configured to receive the cyclic code sequence to provide a scaled code sequence, the second summing circuit further configured to receive the scaled code sequence.

Certain embodiments relate to a dither-less delta-sigma modulator configured to generate a cyclic output code. The dither-less delta-sigma modulator comprises a feedback filtering network including a first feedback loop and a second feedback loop that includes a summing circuit and a gain circuit configured to introduce a small error signal into the first feedback loop to disrupt tonal behavior due to the cyclic output code. In an embodiment, the feedback filtering network further includes a third feedback loop that includes a filter configured to periodically cancel the small error signal in the second feedback loop to reduce static error.

According to a number of embodiments, the disclosure relates to a phase-locked loop (PPL) circuit comprising a phase frequency detector (PFD) configured to generate a first signal representative of a phase difference between a reference signal and a PLL feedback signal, an adjustment circuit in communication with the PFD and configured to generate a control voltage based on the first signal, a voltage-controlled oscillator (VCO) in communication with the adjustment circuit and configured to generate an output signal based on the control voltage, a divider circuit configured to receive the output signal and to generate an updated version of the PLL feedback signal, and a dither-less delta-sigma modulator in communication with the divider circuit and including a feedback filtering network including a first feedback loop and a second feedback loop that includes a gain circuit configured to introduce a small error signal into the first feedback loop to disrupt tonal behavior due to the cyclic output code. In an embodiment, the first feedback loop includes a first summing circuit configured to provide a first summed signal based on an output of the divider circuit and a modulator feedback signal, a quantizing circuit configured to quantize the first summed signal to generate the cyclic output code, a second summing circuit configured to combine the first summed signal and the cyclic output code to provide a second summed signal, and a first filter configured to filter the second summed signal to provide the modulator feedback signal. In another embodiment, the second feedback loop includes a gain component configured to receive the cyclic output code to provide a scaled output code, where the second summing circuit further configured to combine the scaled output code with the first summed signal and the cyclic output code to provide the second summed signal. In a further embodiment, the dither-less delta-sigma modulator further includes a third feedback loop that periodically cancels gain from the scaled output code in the second feedback loop and that includes a second filter configured to receive the scaled output code and to provide a filtered gain signal based on the scaled output code, where the second summing circuit is further configured to receive the filtered gain signal in order to average error in the modulator feedback signal so that the dither-less delta-sigma modulator provides approximately zero static error. In a yet further embodiment, the second filter includes a delay element.

In accordance with various embodiments, a wireless device comprises an antenna configured to facilitate reception of a radio frequency (RF) signal, a receiver in communication with the antenna, the receiver configured to process the RF signal, and a frequency synthesizer in communication with the receiver, where the frequency synthesizer circuit has a phase-locked loop (PLL) circuit having a divider circuit and a dither-less delta-sigma modulator in communication with the divider circuit and includes a feedback filtering network including a first feedback loop and a second feedback loop that includes a gain circuit configured to introduce a small error signal into the first feedback loop to disrupt tonal behavior due to the cyclic output code. In an embodiment, the first feedback loop includes a first summing circuit configured to provide a first summed signal based on an output of the divider circuit and a modulator feedback signal, a quantizing circuit configured to quantize the first summed signal to generate a cyclic output code, a second summing circuit configured to combine the first summed signal and the cyclic output code to provide a second summed signal, and a first filter configured to filter the second summed signal to provide the modulator feedback signal. In another embodiment, the second feedback loop includes a gain component configured to receive the cyclic output code to provide a scaled output code, the second summing circuit further configured to combine the scaled output code with the first summed signal and the cyclic output code to provide the second summed signal. In a further embodiment, the dither-less delta-sigma modulator further includes a third feedback loop that periodically cancels the gain from the scaled output code in the second feedback loop and that includes a second filter configured to receive the scaled output code and to provide a filtered gain signal based on the scaled output code, where the second summing circuit is further configured to receive the filtered gain signal in order to average error in the modulator feedback signal so that the dither-less delta-sigma modulator provides approximately zero static error. In a yet further embodiment, the second filter includes a delay element.

Other embodiments relate to a method to operate a phase-locked loop (PLL) circuit in a frequency synthesizer of a wireless device. The method comprises generating a first signal representative of a phase difference between a reference signal and a PLL feedback signal, generating a control voltage based on the first signal, generating an output signal based on the control voltage, generating an updated version of the PLL feedback signal based on the output signal and a cyclic output code provided by a dither-less delta-sigma modulator including a modulator feedback loop that provides an updated version of the cyclic output code, and introducing a small error signal into the modulator feedback loop to disrupt tonal behavior due to the cyclic output code. In an embodiment, the method further comprises combining a divided signal based on the output signal and a modulator feedback signal to provide a first summed signal. In another embodiment, the method further comprises quantizing the first summed signal to generate the cyclic output code. In a further embodiment, the method further comprises scaling the cyclic output code. In a yet further embodiment, the method further comprises combining the first summed signal, the cyclic output code, and the scaled cyclic output code to provide a second summed signal, where the scaled cyclic output code provides the small error signal. In an embodiment, the method further comprises filtering the second summed signal to provide the modulator feedback signal. In another embodiment, the method further comprises filtering the scaled cyclic output code to provide a filtered gain signal and combining the first summed signal, the cyclic output code, the scaled cyclic output code, and the filtered gain signal to provide the second summed signal. In another embodiment, the filtered gain signal periodically cancels gain from the cyclic output code to reduce static error.

DETAILED DESCRIPTION

Figure 1:
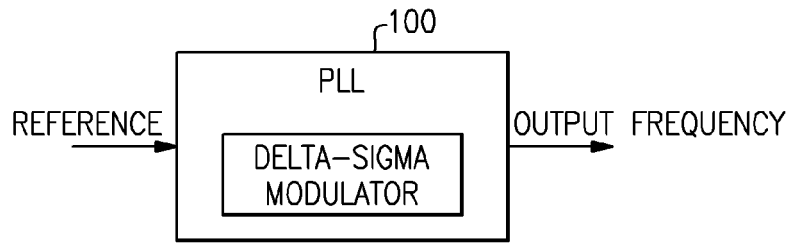
FIG. 1 schematically depicts a phase-locked loop (PLL) comprising a delta-sigma modulator, according to certain embodiments.

In some embodiments, a radio frequency (RF) device such as a wireless device can include a frequency synthesizer having a phase-locked loop (PLL). FIG. 1 schematically depicts a PLL 100 that can be configured to receive a reference signal and generate an output signal having a desired output frequency. Such a PLL can include a delta-sigma modulator having one or more desirable features as described herein.

In some embodiments, a PLL having one or more features of the present disclosure can be implemented in a radio frequency (RF) device such as a wireless device. Such a wireless device can include, for example, a cellular phone, a smartphone, a hand-held wireless device with or without phone functionality, a wireless tablet, etc. Although described in the context of a wireless device, it will be understood that one or more features of the present disclosure can also be implemented in other RF systems, including, for example, a base-station.

Figure 2:
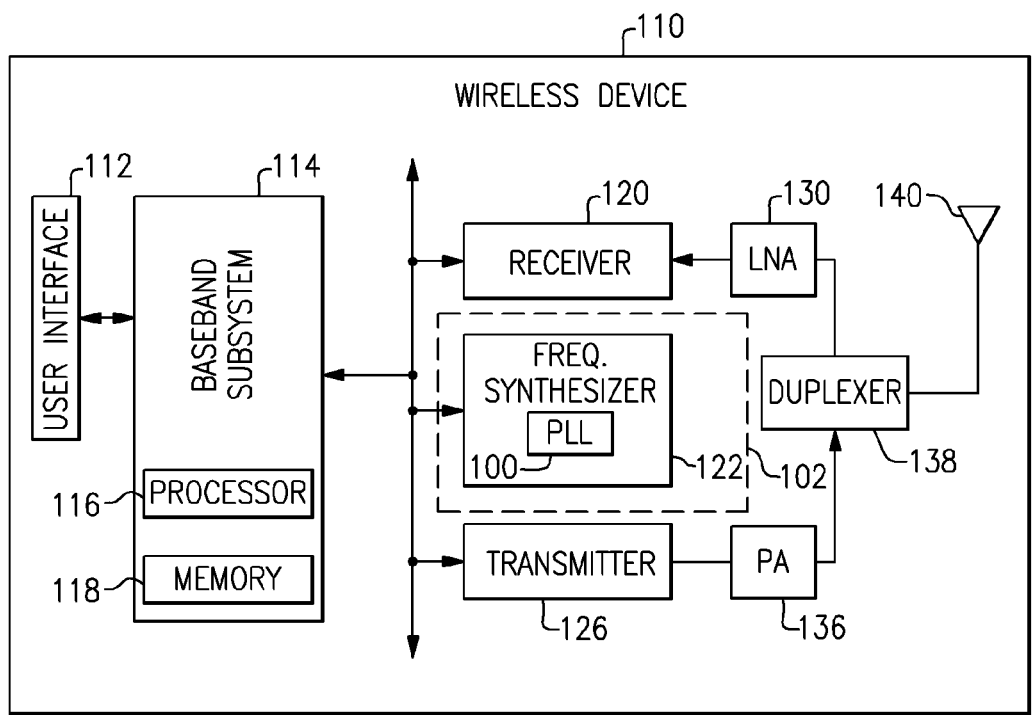
FIG. 2 illustrates a wireless device in which the PLL of FIG. 1 can be implemented, according to certain embodiments.

FIG. 2 schematically depicts an example of a wireless device 110 having one or advantageous features described herein. The wireless device 110 is shown to include an antenna 140 configured to facilitate transmission (TX) and/or reception (RX) of RF signals. Such TX and/or RX operations can be performed simultaneously by use of a duplexer 138. Although described in the context of such duplex functionality and common antenna, other configurations are also possible.

A received signal is shown to be routed from the antenna 140 to a receiver circuit 120 via the duplexer 138 and a low-noise amplifier (LNA) 130. For transmission, a signal to be transmitted is shown to be generated by a transmitter circuit 126 and routed to the antenna 140 via a power amplifier (PA) 136 and the duplexer 118. The receiver circuit 120 and the transmitter circuit 126 may or may not be part of a same component (e.g., a transceiver). In some embodiments, a wireless device 110 can include both of the receiver and transmitter circuits, or just one circuit (e.g., receiver or transmitter).

The wireless device 110 is shown to further include a frequency synthesizer circuit 122 having a phase-locked loop (PLL) 100. Such a circuit (122) can include one or more features as described herein to provide advantages for either or both of RX and TX functionalities associated with the wireless device 110.

The receiver circuit 120, the transmitter circuit 126, and the frequency synthesizer circuit 122 are shown to be in communication with a baseband subsystem 114 which can include, for example, a processor 116 configured to control a number of operations associated with the wireless device 110, and a memory 118 configured to store data, executable instructions, etc. The baseband subsystem 114 is also shown to be in communication with a user interface 112 to allow interfacing of various functionalities of the wireless device 110 with a user.

As shown in FIG. 2, at least some of the one or more features associated with the frequency synthesizer 122 can be implemented in an RF module 102. Such a module can include a packaging substrate configured to receive a plurality of components. The module 102 can include one or more semiconductor die mounted on the packaging substrate. Such one or more die can include some or all of the circuit that provides various functionalities associated with the frequency synthesizer 122.

Figure 3:
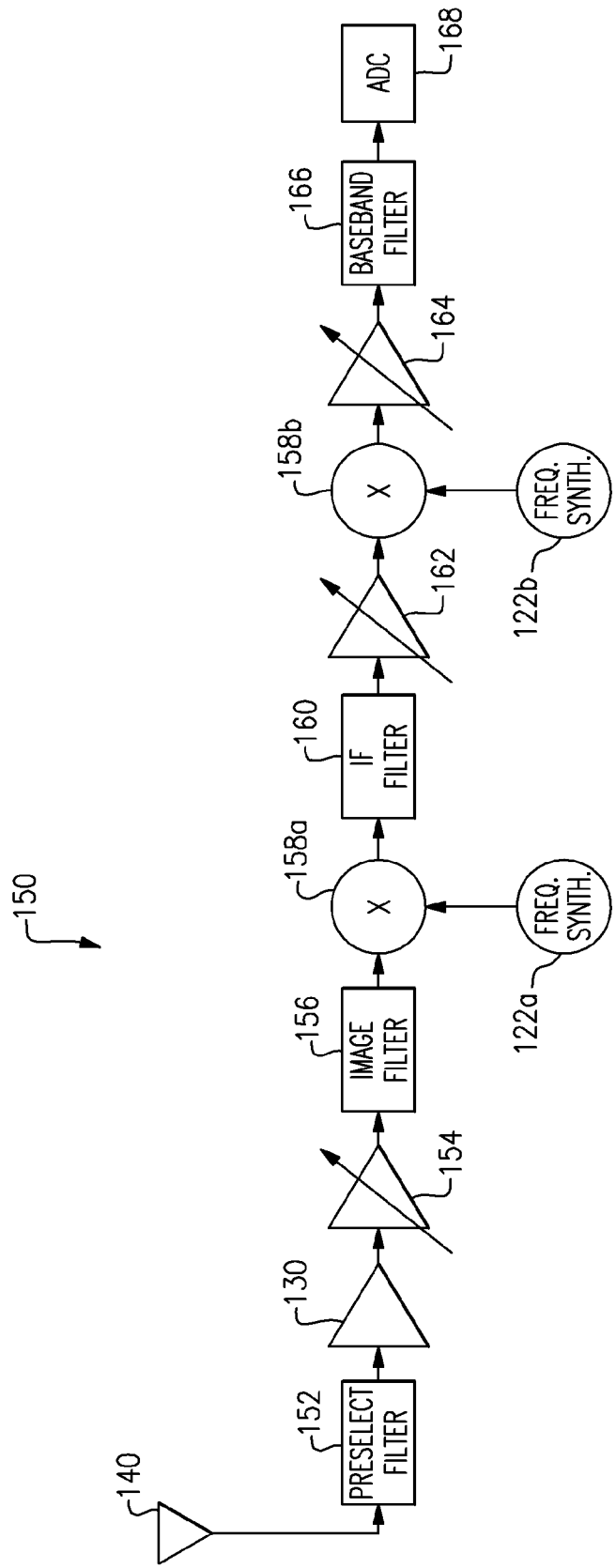
FIG. 3 illustrates that in some embodiments, the PLL of FIG. 1 can be implemented in a frequency synthesizer that facilitates processing of a received radio frequency (RF) signal.

FIG. 3 shows an example of a configuration 150 where one or more frequency synthesizers can be implemented in a receiver chain of a wireless device. Although described in such a receiver chain context, it will be understood that one or more features of the present disclosure can also be implemented in other parts of a wireless device.

A signal received by the antenna 140 can be passed through a preselect filter 152 configured to pass a desired receive band. The preselect filter 152 can work in conjunction with an image filter 156 to further isolate the receive band. Both of these filters can pass substantially the entire receive band, since channel selection does not occur until more downstream of the receiver chain.

A low-noise amplifier (LNA) 130 can be implemented to boost the incoming signal. Such an LNA can be configured to provide this gain while degrading the signal-to-noise ratio (SNR) as little as possible. An automatic gain control (AGC) circuit 154 can be configured to allow the wireless device to handle a wide range of expected input power levels. For example, a low powered incoming signal can require a greater boost than a higher powered incoming signal.

A first mixer 158a can be configured to convert the RF channels down to lower frequencies and center a desired channel at a specific intermediate frequency (IF). Such a specific IF can be provided to the first mixer 158a from a first frequency synthesizer 122a.

At this stage, the entire received-and-filtered band is now mixed down to the IF. An IF filter 160 can be configured to isolate the channel of interest from the receive band. An AGC circuit 162 can be configured to allow the wireless device to handle a wide range of expected input power levels associated with the isolated channel of interest.

A second mixer 158b can be configured to convert the foregoing isolated channel signal down to a baseband signal. Such down-conversion can be facilitated by a second frequency synthesizer 122b configured to generate and provide a desired baseband frequency to the second mixer 158b.

An AGC circuit 164 can be configured to allow the wireless device to handle a wide range of expected input power levels associated with the output of the second mixer 158b. A baseband filter 166 can be configured to filter the selected baseband-frequency signal before having the signal sampled by an analog-to-digital converter (ADC) 168. A digital signal resulting from such an ADC can be passed to a baseband sub-system (not shown in FIG. 3).

In the context of the example signal processing configuration of FIG. 3, the first frequency synthesizer 122a generates a clock signal that facilitates the down-conversion of a received signal to an IF signal. Similarly, the second frequency synthesizer 122b generates a clock signal that facilitates the down-conversion of the IF signal to a baseband signal.

As described in reference to FIGS. 1 and 2, a frequency synthesizer can include a PLL. In some embodiments, a PLL can be implemented as a negative feedback control system designed to generate an output at a particular frequency. Such an output can be utilized as an output of the frequency synthesizer.

Figure 4:
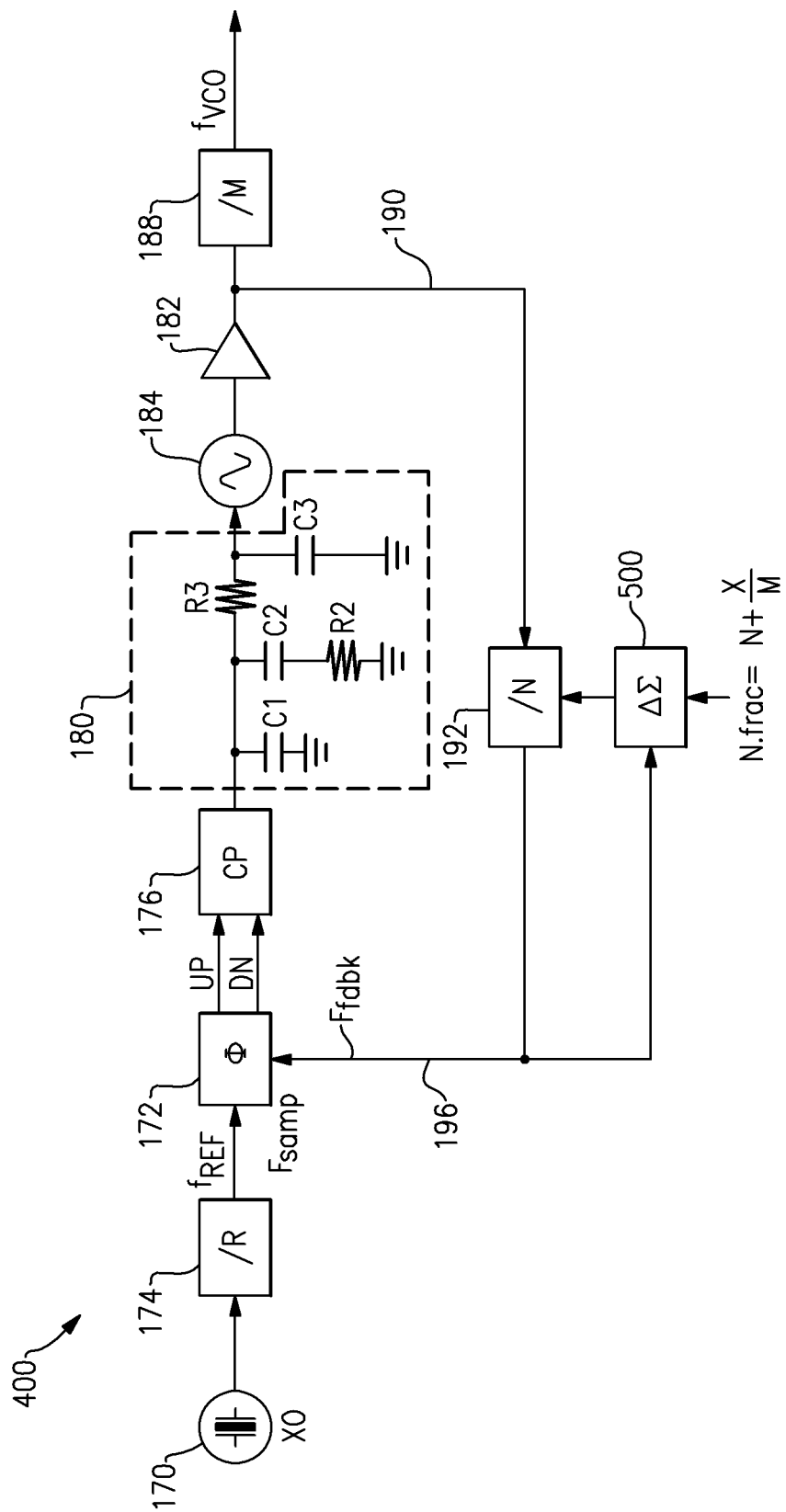
FIG. 4 illustrates an exemplary PLL frequency synthesizer that is capable of operating as a fractional-N PLL, according to certain embodiments.

FIG. 4 shows an example configuration of a PLL circuit 400, which can be a part of the frequency synthesizer 122. As shown, a crystal oscillator 170 outputs a clock signal to a 1/R divider 174 which divides the clock signal by R (or multiplies the frequency of the clock signal from the crystal oscillator 170 by R) to provide a reference clock signal to a phase frequency detector (PFD) 172. In some embodiments, the PFD 172 can be configured to compare the rising edges of the reference clock signal and a feedback signal (in path 196) and determine if the feedback signal is leading or lagging with respect to the reference clock signal.

Based on this comparison, the PFD 172 can output a phase error information signal to a charge pump 176. The phase error information signal can be either an UP signal indicating that the feedback signal is too slow when compared with the reference clock signal or a DOWN (DN) signal indicating that the feedback signal is too fast when compared with the reference signal. In response, the charge pump 176 can output a current that is related to the phase difference between the reference and feedback signals.

The foregoing charge pump current can be provided to a loop filter 180 comprising capacitors C1-C3 and resistors R2, R3. The loop filter 180 can be configured to convert the charge pump current into a voltage suitable for driving a voltage controlled oscillator (VCO) 184. The loop filter 180 can also be configured to control loop dynamics of the PLL 400 (e.g., bandwidth, settling time, etc.).

The VCO 184 can be configured to output a signal having a frequency that is related to the driving voltage from the loop filter 180. In some embodiments, the output of the VCO 184 is buffered by buffer 182.

The buffered VCO output is fed into divider circuit 192 (1/N). The divider circuit 192 can be configured to divide the buffered VCO output frequency back down to the reference frequency. A feedback signal from the divider circuit 192 can be fed back into the PFD 172 through path 196 to thereby complete the PLL loop.

The foregoing feedback mechanism allows the output frequency of the PLL 400 to lock on to a frequency that is a multiple of the reference signal frequency. If the multiple is an integer (N), the PLL 400 is considered to be an Integer-N PLL. If the multiple contains a fractional component (1/M), as indicated by divider circuit 188, the PLL 400 is considered to be a Fractional-N PLL.

FIG. 4 further shows a delta-sigma modulator (DSM) 500 in communication with the feedback loop. As described herein, such a DSM can be configured as an additional feedback loop with the divider circuit 192 to allow the PLL 400 to operate as a delta-sigma based fractional-N frequency synthesizer.

In some embodiments, the DSM 500 can be configured to generate a signal that instructs the divider circuit 192 with which integer value to divide the frequency of the VCO output signal. By way of an example, suppose that a PLL has a reference signal frequency of 40 MHz, and it is desired to output a signal having a frequency of 2.41 GHz. Such a configuration yields a divide ratio of 60 and ¼. One way the PLL can achieve this divide ratio is to implement dividing by 60 for three reference cycles, then dividing by 61 for one cycle. This pattern can then repeat. Over each repetition the average divide value, Navg, is 60 and ¼ as expected.

In the context of the foregoing example, the DSM 500 can instruct the divider circuit 192 to divide by 60 or 61. Such dithering between two integer divide ratios can allow the divider circuit 192 to be implemented even if the circuit 192 is only capable of integer division. Accordingly, the output frequency of such a fractional-N PLL frequency synthesizer 400 can be an averaged result of a plurality of integer divide values.

A fractional-N PLL frequency synthesizer is used to synthesize a reference that is higher than the channel spacing. This is important in multi-bands and multi-standards applications where the channel spacing is different from standard to standard. Equation 1 shows the relationship of the reference frequency ($f_{REF}$) and the synthesized VCO frequency ($f_{VCO}$) at the output of the divider 188.

$$f_{vco} = f_{ref} \times \left(N + \frac{x}{M}\right) \quad (1)$$

where $f_{vco}$ is the synthesized vco frequency, $f_{ref}$ is the reference frequency, N &

$$\frac{x}{M}$$

are the integer & frac part of the division value

Figure 5:
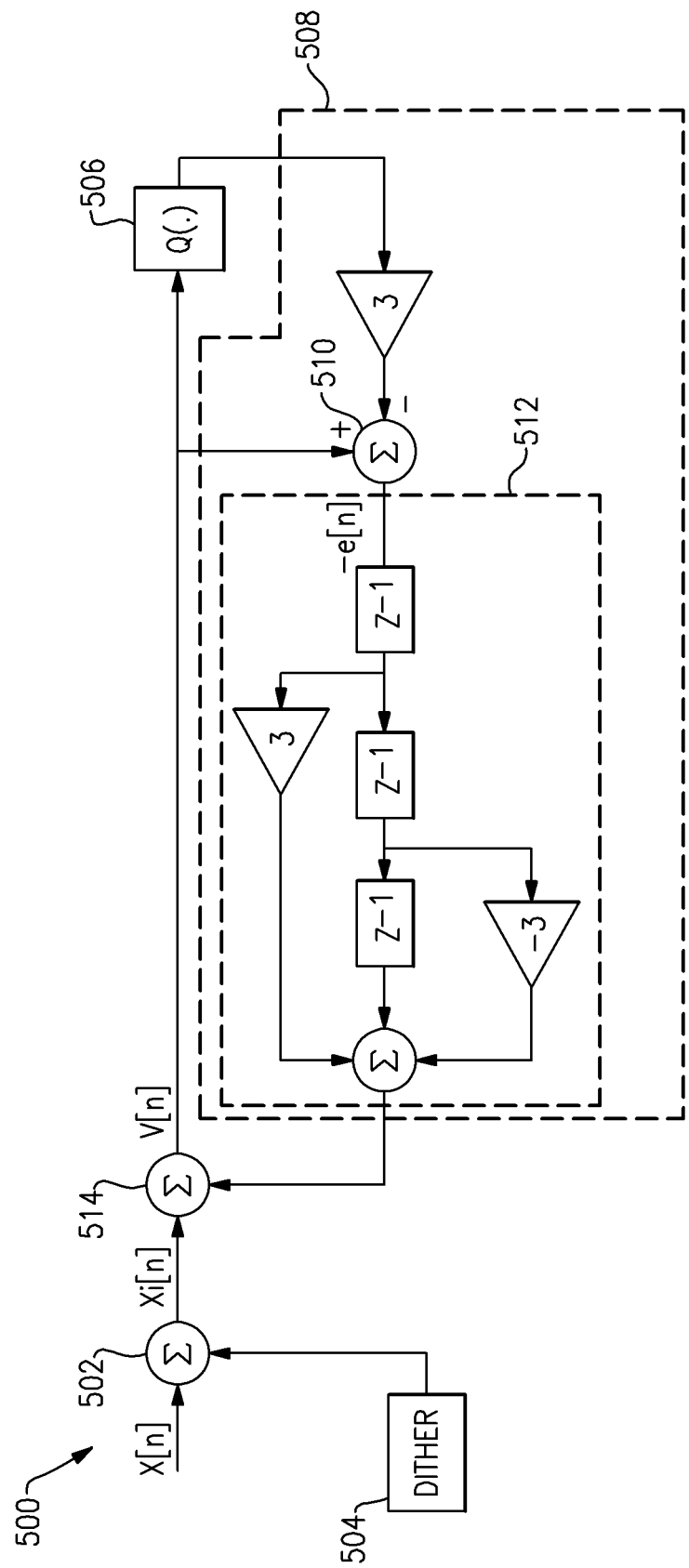
FIG. 5 is an exemplary $3^{rd}$ order Error Feedback Modulator (EFM3) including dither that can be implemented in the frequency synthesizer of FIG. 4, according to certain embodiments.

Embodiments of some fractional-N PLL frequency synthesizers 400 make use of higher order multi-stage noise shaping structure (MASH) and Single Loop delta-sigma modulators, such as a 3rd order Error Feedback Modulator (EFM3) 500, shown in FIG. 5, to generate divider value sequences that on average yield the required division ratios as discussed above. The EFM3 500 comprises a finite state machine that generates cyclic train of division ratios. These introduce fractional spurious tones due to the cyclic output code.

In the illustrated embodiment of FIG. 5, a first summing circuit 502 receives the input signal and a dithering signal from a dither component 504. A second summing circuit 514 receives the dithered input signal and a feedback signal. A quantizer 506 receives the summed signal and outputs a quantized output signal. A $3^{rd}$ order feedback loop 508 comprises a third summing circuit 510 and a $3^{rd}$ order filter 512. The third summing circuit 510 receives the summed signal and the output signal and generates an error signal. The filter 512 receives the error signal and outputs the feedback signal.

In general, dithering and or seeding are used to alleviate the presence of delta-sigma fractional spurs. Dithering disturbs the tonal behavior by randomizing the code sequence but inherently adds significant in-band noise. Seeding or initial condition setting may help with a limited number of fractional channels. Randomization due to this technique is input dependent and may not remove all fractional spurs in most frequency channels. Another issue with seeding is it generates unwanted static frequency errors. Thus, in high performance applications, dither and seeding techniques may not be useful since they significantly increase in-band noise and introduce large frequency errors.

Figure 6:
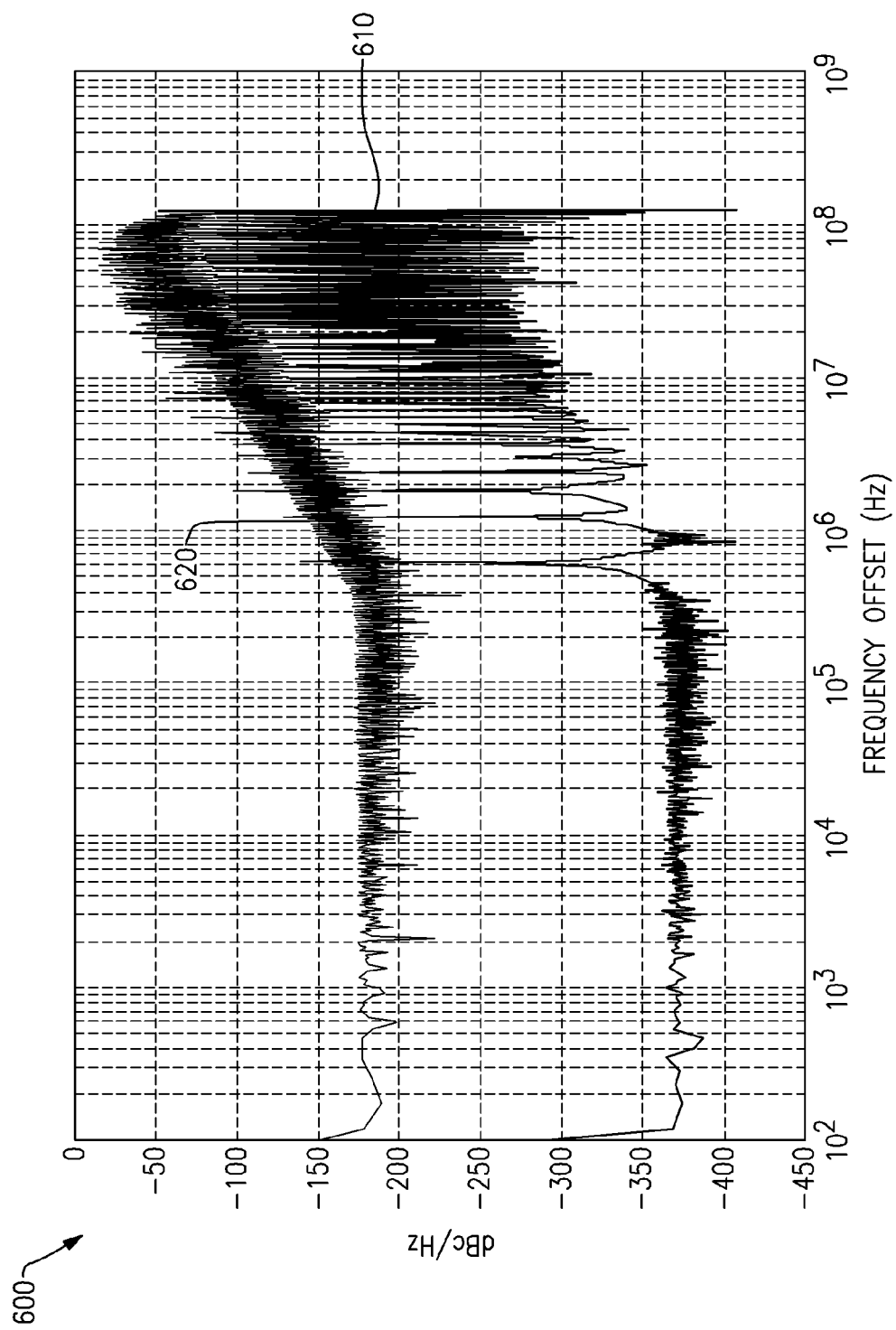
FIG. 6 is a plot of the Fast Fourier Transform (FFT) of the output code sequence of the $3^{rd}$ order Error Feedback Modulator (EFM3) with and without dithering, according to certain embodiments.

FIG. 6 illustrates a Fast Fourier Transform (FFT) 600 of the output code sequence of a typical 3rd order delta-sigma modulator with and without dithering. Curve 610 shows the modulator output without dither and curve 620 shows the modulator output with dither for a frequency synthesizer As shown in FIG. 6, curve 620 (with dither) has fewer spurious frequencies than curve 610 (without dither), but the in-band noise of curve 620 (with dither) is significantly higher than curve 610 (without dither).

Delta-Sigma Based Fractional-N Frequency Synthesizer

Figure 7:
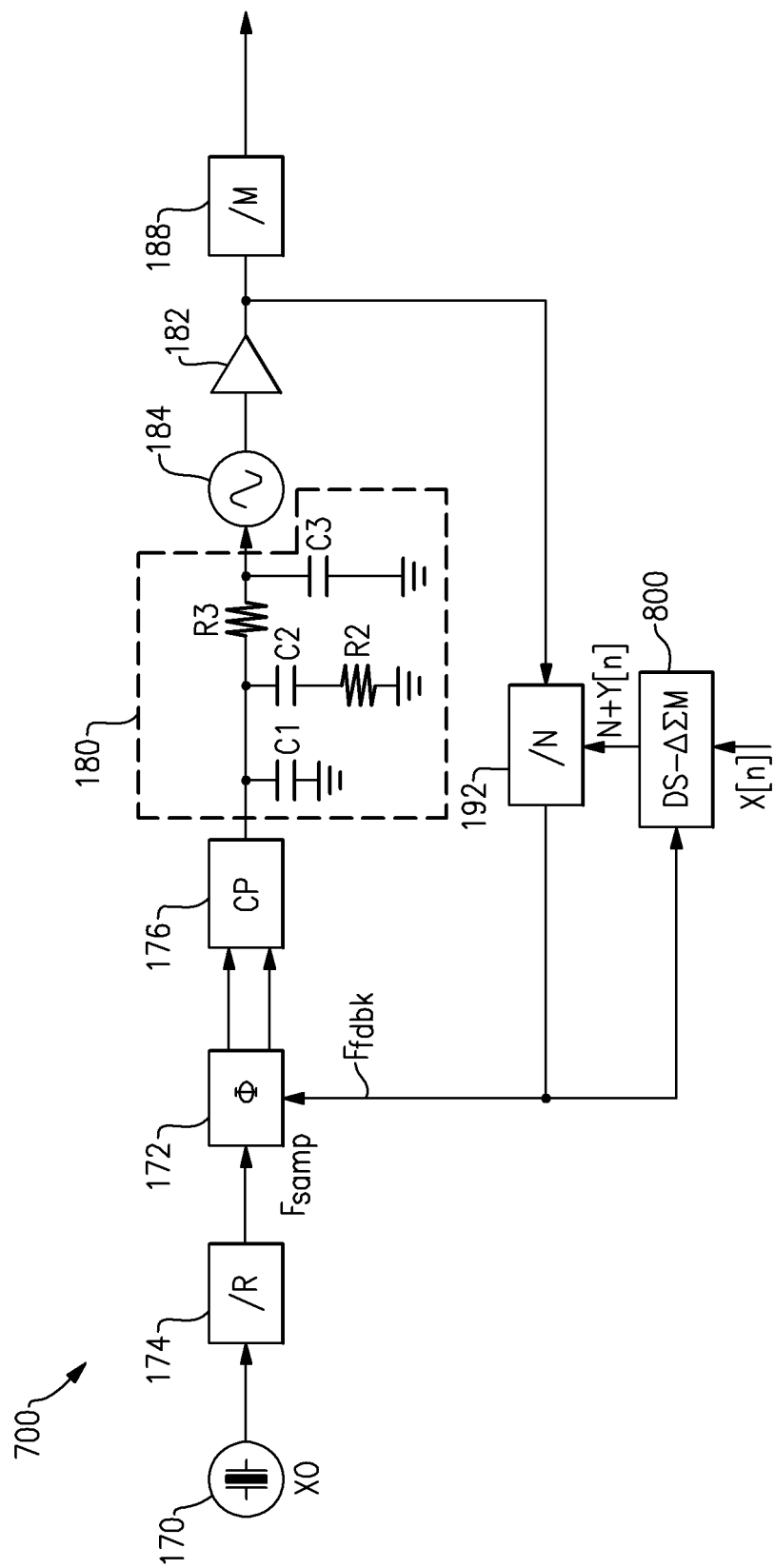
FIG. 7 illustrates an embodiment of a Dither-less Seed-less Error Feedback-based fractional-N frequency synthesizer, according to certain embodiments.

FIG. 7 illustrates an embodiment of a Dither-less Seed-less EFM-based Fractional-N Frequency Synthesizer 700 which can be a part of the frequency synthesizer 122. Frequency synthesizer 700 comprises the crystal oscillator 170, the 1/R divider 174, the phase detector 172, the charge pump 176, the loop filter 180, the VCO 184, the buffer 182, and dividers 188, 192 as described above with respect to FIG. 4. The frequency synthesizer 700 further comprises a Dither-less Seed-less Error Feedback Modulator (DS-EFM) 800. In the illustrated embodiment, the DS-EFM 800 comprises a $3^{rd}$ order Dither-less Seed-less Error Feedback Modulator (DS-EFM3) 800. The DS-EFM3 800 does not use dithering to remove fractional-N spurious tones.

Figure 8:
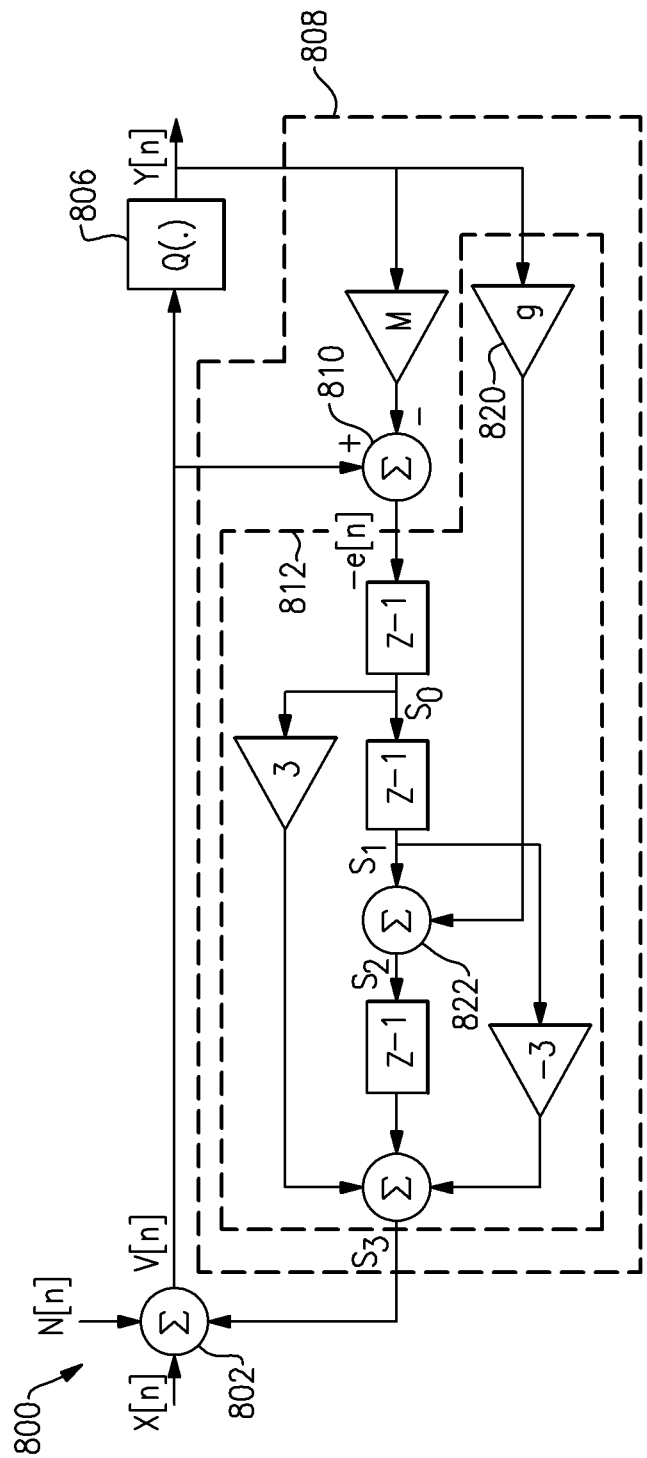
FIG. 8 illustrates an exemplary $3^{rd}$ order Dither-less Seed-less Error Feedback Modulator (DS-EFM3) that can be implemented in the frequency synthesizer of FIG. 7, according to certain embodiments.

FIG. 8 illustrates an embodiment of the DS-ESM3 800 comprising a 3rd order single Loop EFM with an additional feedback loop comprising a scaled version of the output sequence summed into the feedback filtering network.

In the illustrated embodiment of FIG. 8, a first summing circuit 802 receives an input signal and a feedback signal and combines them to generate a summed signal. A quantizer 806 receives the summed signal and outputs a quantized output signal. A $3^{rd}$ order feedback loop 808 comprises a second summing circuit 810 and a $3^{rd}$ order filter 812 including an additional feedback loop. The additional feedback loop comprises a gain component 820 and a third summing circuit 822.

The second summing circuit 810 receives the summed signal and the quantized output signal and generates an error signal. The gain component 820 receives the quantized output signal and scales the quantized output signal to generate a scaled version of the output signal/output sequence. The filter 812 receives the error signal and the scaled version of the output signal/output sequence. This scaled version of the output sequence is added to the feedback network of filter 812 at the third summing circuit 822. The additional feedback based on the scaled version of the output signal/output sequence adds a small amount of error to the feedback signal such that the fractional spurious tones are disrupted.

Embodiments of the DS-EFM3 800 without the additional feedback will suffer from fractional spurious tones unless dithering or seeding is used. The Signal and Noise Transfer Functions of the EFM3 500, such as in FIG. 5, are given in equation 2.

$$STF = \frac{1}{M} \quad (2)$$
&
$$NTF = (1 - Z^{-1})^3$$

A mathematical derivation of the Signal Transfer Function (SFT) and the Noise Transfer Function (NTF) of the DS-EFM3 800 are:

$$V[n] = -E[n-3] + g \cdot Y[n-1] + 3E[n-2] - 3E[n-1] + X[n] \quad (3)$$

$$-E[n] = V[n] - M \cdot Y[n] \quad (4)$$

Sub (4) in (3)

$$M \cdot Y[n] - g \cdot Y[n-1] = X[n] - E[n-3] + 3E[n-2] - 3E[n-1] + E[n] \quad (5)$$

Using Z-Transform:

$$M \cdot Y(z) - g \cdot Z^{-1} \cdot Y(z) = \\ X(z) - Z^{-3} \cdot Eq(z) + 3Z^{-2} \cdot Eq(z) - 3Z^{-1} \cdot Eq(z) + Eq(z) \quad (6)$$

$$Y(z) \cdot (M - g \cdot Z^{-1}) = X(z) + Eq(z) \cdot (1 - 3Z^{-1} + 3Z^{-2} - Z^{-3}) \quad (7)$$

$$Y(z) = \frac{X(z)}{(M - g \cdot Z^{-1})} + Eq(z) \cdot \frac{(1 - Z^{-1})^3}{(M - g \cdot Z^{-1})} \quad (8)$$

$$Y(z) = \frac{1}{M} \cdot \frac{X(z)}{(1 - \delta \cdot Z^{-1})} + E(z) \cdot \frac{(1 - Z^{-1})^3}{(1 - \delta \cdot Z^{-1})} \quad (9)$$

where (10)

$$\delta = \frac{g}{M}$$

and $$E(z) = \frac{Eq(z)}{M}$$

$$STF = \frac{1}{M \cdot (1 - \delta \cdot Z^{-1})} \quad (11)$$
&
$$NTF = \frac{(1 - Z^{-1})^3}{(1 - \delta \cdot Z^{-1})}$$

Setting δ=0, the STF and the NTF are:

$$STF = \frac{1}{M} \quad (12)$$
&
$$NTF = (1 - Z^{-1})^3$$

From equations 11 and 12, it is very easy to notice that the additional error introduced in the system is so small that it does not alter the noise shaping characteristics of the modulator and yet it is large enough to continuously disrupt the tonal behavior of traditional high order modulators 500.

Figure 9:
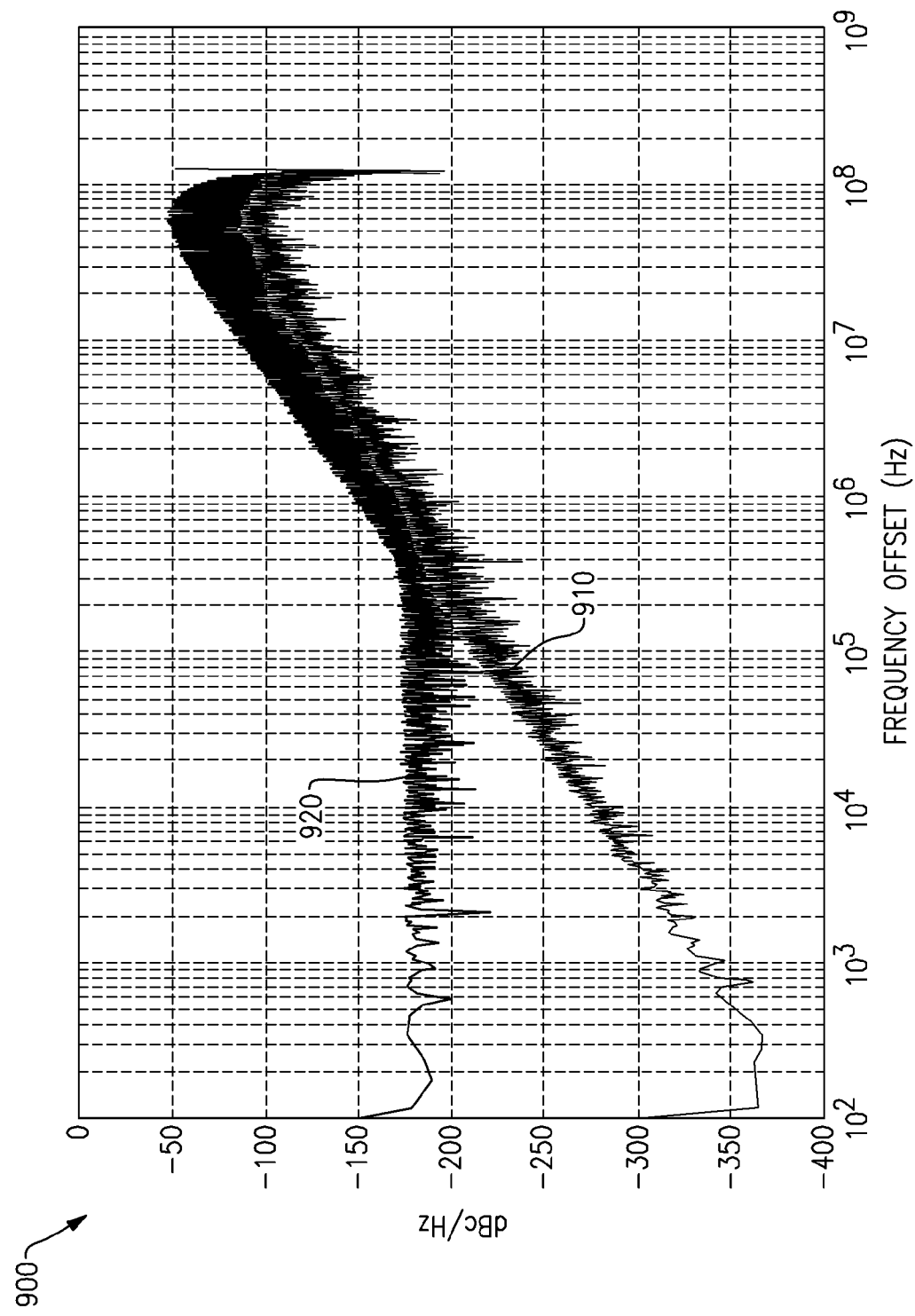
FIG. 9 is a plot of the FFT of the output code sequences of the $3^{rd}$ order Error Feedback Modulator (EFM3) of FIG. 5 and the $3^{rd}$ order Dither-less Seed-less Error Feedback Modulator (DS-EFM3) of FIG. 8, according to certain embodiments.

FIG. 9 is a plot of the FFT of the output code sequences of an embodiment of the EFM3 500 of FIG. 5 including dithering and an embodiment of the DS-EFM3 800 of FIG. 8. Curve 910 shows the FFT for the DS-EFM3 800 and curve 920 shows the FFT for the Dithered EFM3 500. Referring to equations 2 and 12, the Signal and Noise transfer functions for the DS-EFM3 800 and the Dithered EFM3 500 are approximately the same. As illustrated in FIG. 9, the output signal of the DS-EFM3 800 has no out-of-band spurious tones, similar to the output signal of the dithered EFM3 500, without any impact on the in-band noise floor.

Figure 10:
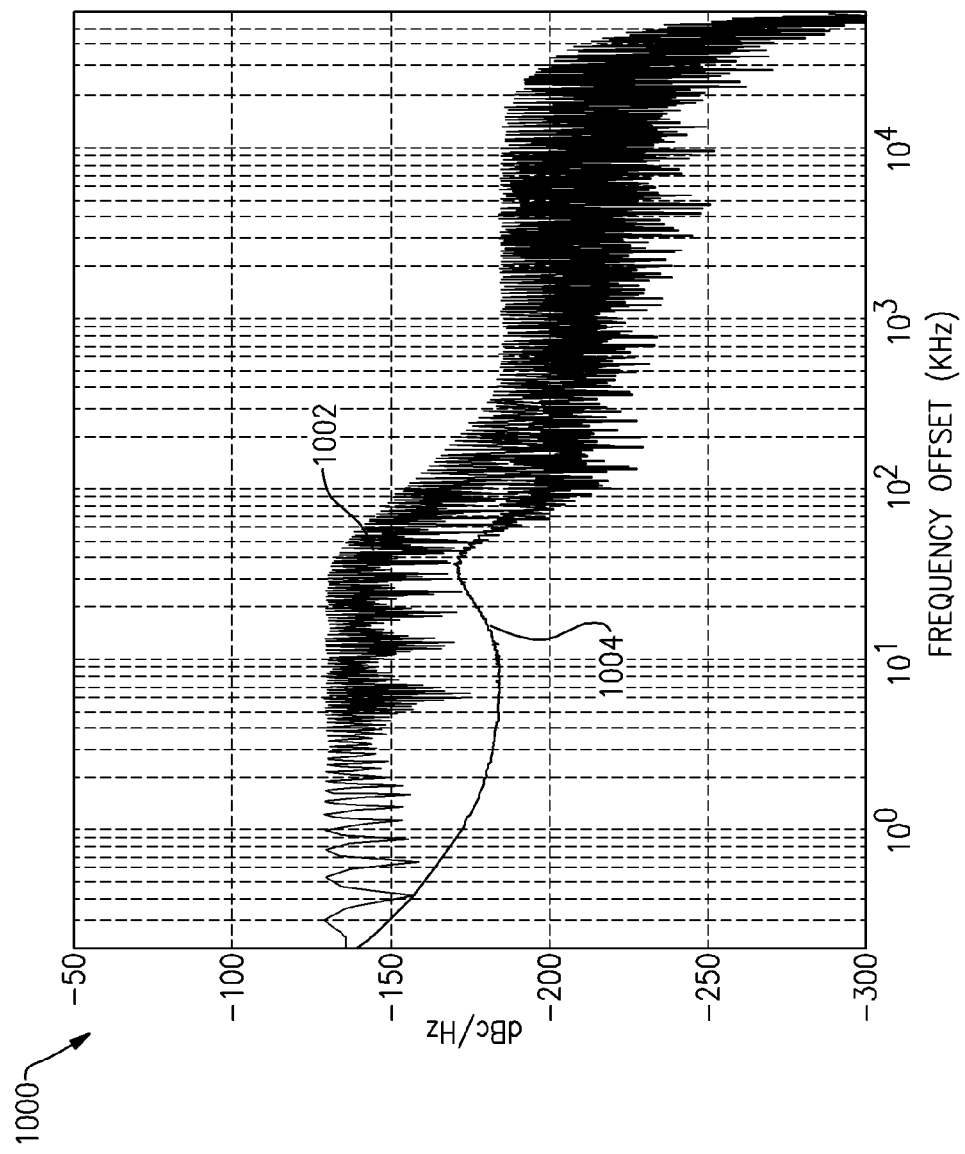
FIG. 10 illustrates plots of an exemplary synthesized output frequency for a PLL Frequency Synthesizer including the dithered EFM3 of FIG. 5 and including the DS-EFM3 of FIG. 8, according to certain embodiments.

FIG. 10 is a plot 1000 illustrating exemplary synthesized output frequencies for a PLL Frequency Synthesizer including the dithered EFM3 500 of FIG. 5 (curve 1102) and including the DS-EFM3 800 of FIG. 8 (curve 1104). Curve 1004 for the DS-EFM3 shows a superior noise performance in-band, below 100 KHz offset frequency.

Embodiments of the Dither-less and Seed-less EFMs can be implemented on other high order single loop modulators and hence are not restricted to 3rd order modulators.

Figure 11:
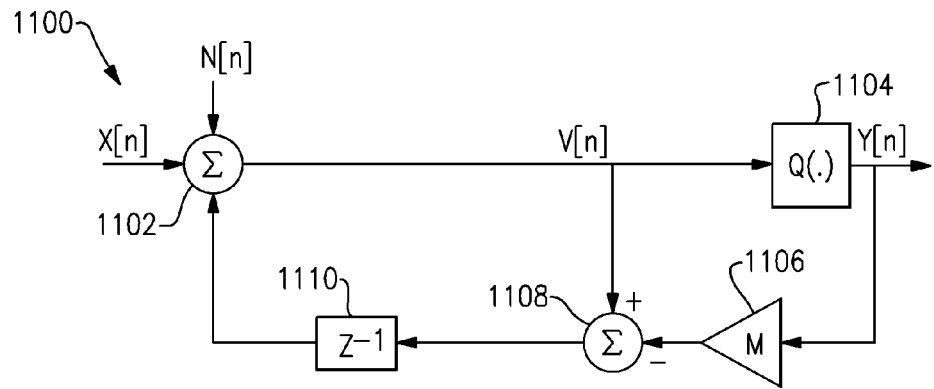
FIG. 11 illustrates an exemplary $1^{st}$ order Error Feedback Modulator (EFM1), according to certain embodiments.

FIG. 11 illustrates an exemplary $1^{st}$ order Error Feedback Modulator (EFM1) 1100. In the illustrated embodiment, a first summing circuit 1102 receives the input signal and a feedback signal and outputs a summed signal. A quantizer or quantizing circuit 1104 receives the summed signal and outputs a quantized output signal to an amplifier 1106. A second summing circuit 1108 receives the summed signal and the amplified output signal from the amplifier 1106 and generates an error signal. In an embodiment, the second summing circuit 1108 generates the error signal by subtracting the amplified output signal from the summed signal. A first order filter 1110 receives the error signal, filters the error signal, and outputs the feedback signal.

Dither-less Seed-less MASH Architecture Error Feedback Modulator

Figure 12:
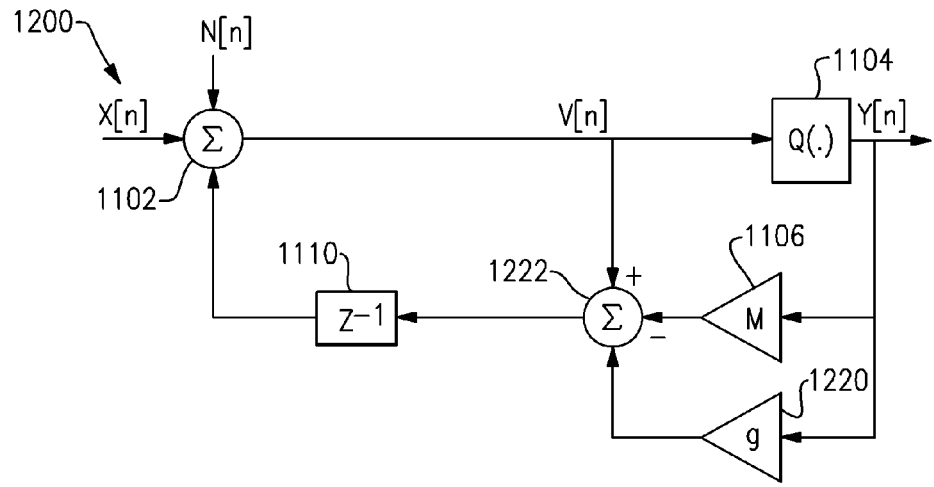
FIG. 12 illustrates an exemplary Dither-less Seed-less $1^{st}$ order Error Feedback Modulator (DS-EFM1), according to certain embodiments.

FIG. 12 illustrates an exemplary Dither-less Seed-less $1^{st}$ order Error Feedback Modulator (DS-EFM1) 1200 comprising the EFM1 1100 of FIG. 11 with an additional feedback loop comprising a scaled version of the output sequence added into the feedback filtering loop. The additional feedback loop comprises a gain component 1220. The gain component 1220 receives the output sequence from the quantizing circuit, indicated as 1104 in FIG. 11, and outputs a scaled version of the output sequence. The output of the gain component 1220 is added into the feedback filtering loop at a summing circuit 1222.

Figure 13:
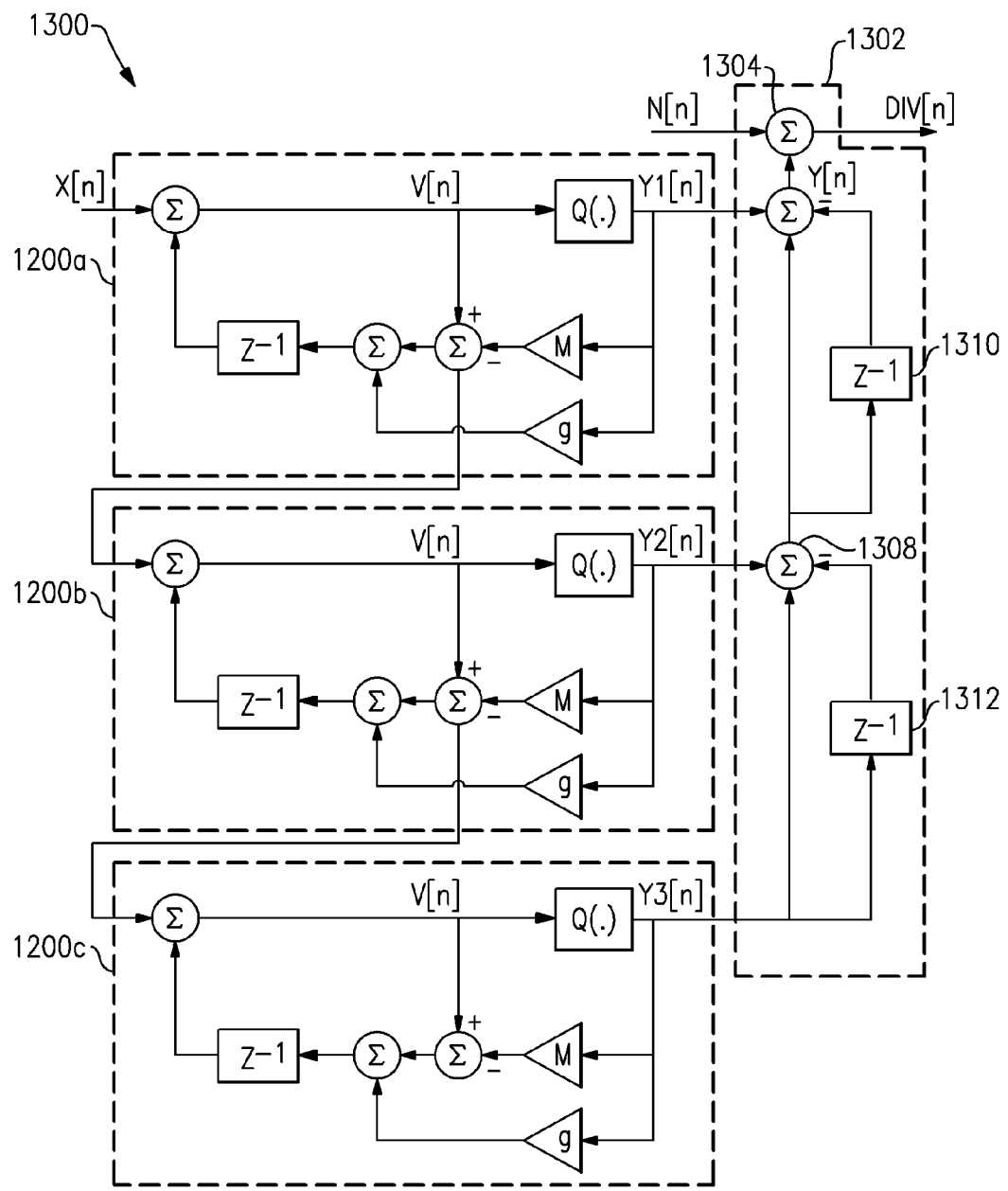
FIG. 13 illustrates an exemplary $3^{rd}$ order Dither-less Seed-less MASH architecture modulator (DS-MASH111), according to certain embodiments.

FIG. 13 illustrates an embodiment of a modulator 1300 having a multi-stage noise shaping (MASH) architecture comprising three DS-EFM1 stages 1200a, 1200b, 1200c and a summing circuit 1302. This new architecture is termed DS-MASH111. Each stage 1200a, 1200b, 1200c operates similarly to the DS-EFM1 1200 of FIG. 12. The three DS-EFM1 stages 1200a, 1200b, 1200c are cascaded such that the first DS-EFM1 stage 1200a receives the input signal and the first stage feedback signal and outputs a first stage summed signal. The first stage quantizer or quantizing circuit receives the first stage summed signal and outputs a first stage quantized output signal to the first stage amplifier. A first stage second summing circuit receives the first stage summed signal and the first stage amplified output signal from the first stage amplifier and generates the first stage error signal. The first stage gain component receives the first stage output sequence from the first stage quantizing circuit and outputs a first stage scaled version of the first stage output sequence. The output of the first stage gain component 1220 is combined with the first stage error signal and input to the first stage filter. The filtered output signal from the first stage filter comprises the feedback signal for the first stage of the DS-MASH111 modulator 1300.

The second stage 1200b receives the error signal from the first stage 1200a and the second stage feedback signal and operates similarly to the first stage 1200a. Likewise, the third stage 1200c receives the error signal from the second stage 1200b and the third stage feedback signal and operates similarly to the first stage 1200a.

The summing circuit 1302 comprises a first summing circuit 1304, a second summing circuit 1306, a third summing circuit 1308, a first filter 1310, and a second filter 1312. The second filter 1312 filters the third stage quantized output. The third summing circuit 1308 combines the third stage quantized output signal, the filtered version of the third stage quantized output signal, and the second stage quantized output signal to produce a first combined signal. The first filter 1310 filters the first combined signal. The second summing circuit 1306 combines the first combined signal, the filtered version of the first combined signal, and the first stage quantized output signal to produce a second combined signal. The first summing circuit 1304 combines the second combined signal and an output of a divider circuit from the PLL feedback loop comprising the DS-MASH111 modulator 1300.

Beginning with the 1st order DS-EFM1 1200 from FIG. 12, the mathematical derivation of the Signal and Noise Transfer Functions of the DS-MASH111 1300 are:

$$V[n] = X[n] + S_0[n-1] \quad (13)$$

$$S_0[n] = -E[n] + g \cdot Y[n] \quad (14)$$

$$M \cdot Y[n] = V[n] + E[n] \quad (15)$$

$$V[n] = X[n] + g \cdot Y[n-1] - E[n-1] \quad (16)$$

Substituting equation 16 in equation 15, $$M \cdot Y[n] - g \cdot Y[n-1] = X[n] - E[n-1] + E[n] \quad (17)$$

Using a Z-Transform $$y(z) \cdot [M - g \cdot Z^{-1}] = x(z) + Eq(z) - Eq(z) \cdot Z^{-1} \quad (18)$$

$$y(z) = \frac{x(z)}{(M - g \cdot Z^{-1})} + Eq(z) \cdot \frac{1 - Z^{-1}}{(M - g \cdot Z^{-1})} \quad (19)$$

$$y(z) = \frac{1}{M} \cdot x(z) \cdot \frac{1}{(1 - \delta \cdot Z^{-1})} + E(z) \cdot \frac{1 - Z^{-1}}{(1 - \delta \cdot Z^{-1})}, \quad (20)$$

where $$\delta = \frac{g}{M}$$

&

$$E(z) = \frac{Eq(z)}{M}$$

Assuming that the quantization noise on each DS-EFM1 1200 is additive, the $3^{rd}$ order DS-MASH111 output can be written as:

$$Y(z) = \frac{1}{M} \cdot X(Z) \cdot \frac{1}{(1 - \delta \cdot Z^{-1})} + E(z) \cdot \frac{(1 - Z^{-1})^3}{(1 - \delta \cdot Z^{-1})} \quad (21)$$

The $3^{rd}$ order DS-MASH Signal Transfer Function and Noise Transfer Function are:

$$STF = \frac{1}{M \cdot (1 - \delta \cdot Z^{-1})} \quad (22)$$

&

$$NTF = \frac{(1 - Z^{-1})^3}{(1 - \delta \cdot Z^{-1})}$$

Setting $\delta = 0$, the $3^{rd}$ order DS-MASH Signal Transfer Function and Noise Transfer Function become:

$$STF = \frac{1}{M} \quad (23)$$

&

$$NTF = (1 - Z^{-1})^3$$

Referring to equations 12 and 23, the DS-MASH111 1300 behaves similar to the DS-EFM3 800 of FIG. 8.

Figure 14:
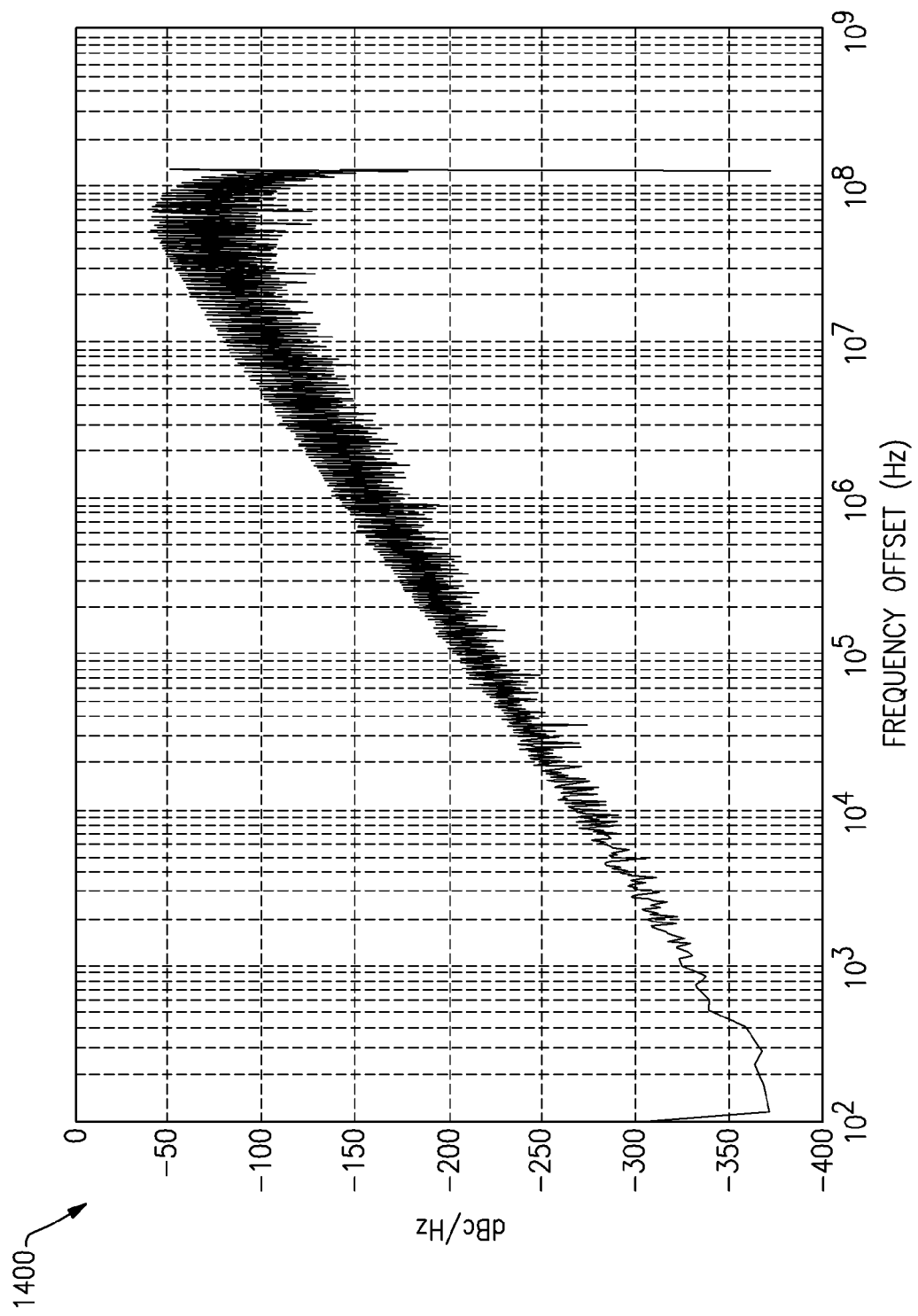
FIG. 14 illustrates the simulated noise output performance for the DS-MASH111 modulator of FIG. 13, according to certain embodiments.

FIG. 14 plot 1400 of the FFT of the output code sequences of an embodiment of the DS-MASH111 1300. Referring to FIGS. 9 and 14, the simulated noise output performance for the DS-MASH111 1300 is approximately the same as the simulated noise performance (curve 910) for the DS-EFM3 800.

Zero Static Frequency Error

Referring to equations 11 and 22, the architecture of the Dither-less Seed-less Error Feedback Modulator (DS-EFM) and the Dither-less Seed-less MASH modulator (DS-MASH) provide a very small static error. This error may be insignificant. However, to provide approximately zero static frequency error, embodiments of the DS-EFM and the DS-MASH can be modified to cancel the gain g every other clock cycle.

Figure 15:
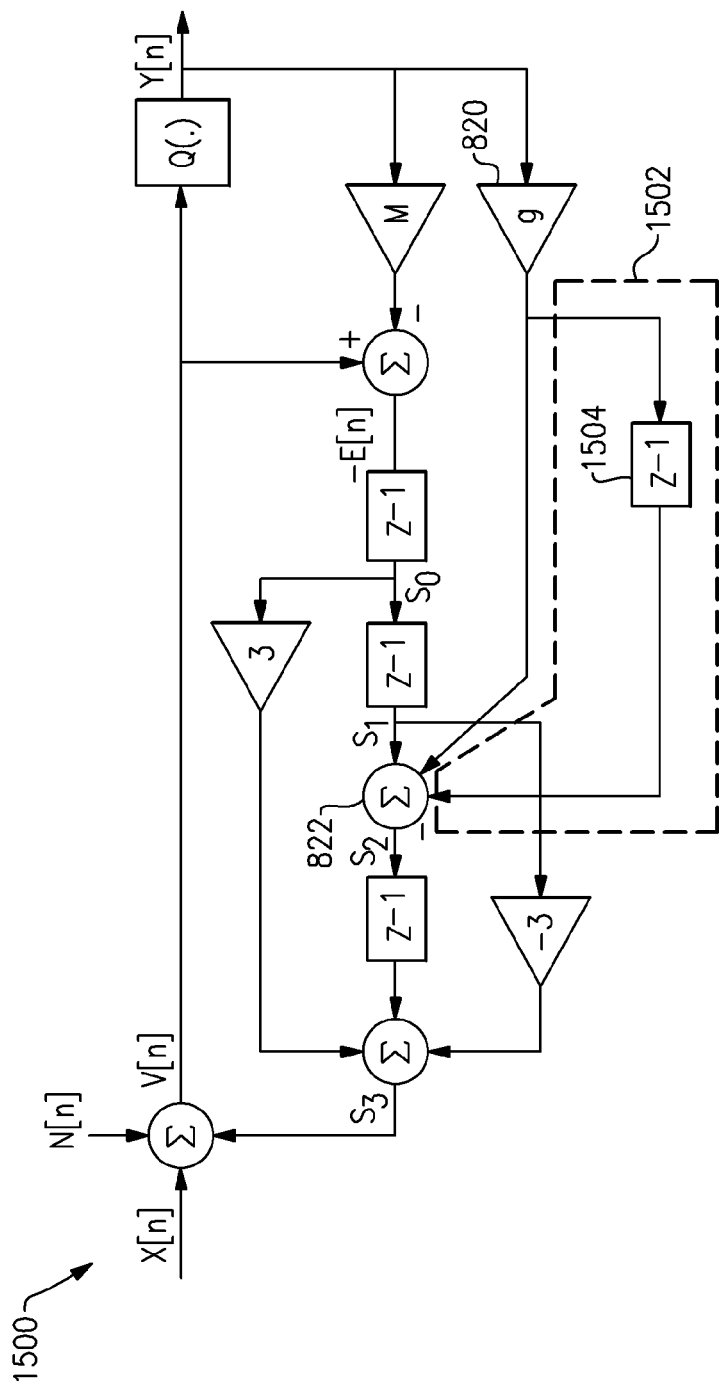
FIG. 15 illustrates an exemplary $3^{rd}$ order Dither-less Seed-less Error Feedback Modulator with approximately zero static error implemented with a 50% duty cycle, according to certain embodiments.

FIG. 15 illustrates an embodiment of a $3^{rd}$ order Dither-less Seed-less Error Feedback Modulator (DS-EFM3) 1500 with approximately zero static error. The zero static error DS-EFM3 1500 comprises the DS-EFM3 800 of FIG. 8 and an additional feedback loop 1502. The feedback loop 1502 comprises a filter 1504 receiving a scaled output from the gain component 820 and outputting a filtered gain signal to the summing circuit 822 in the $3^{rd}$ order feedback loop 812.

Figure 16:
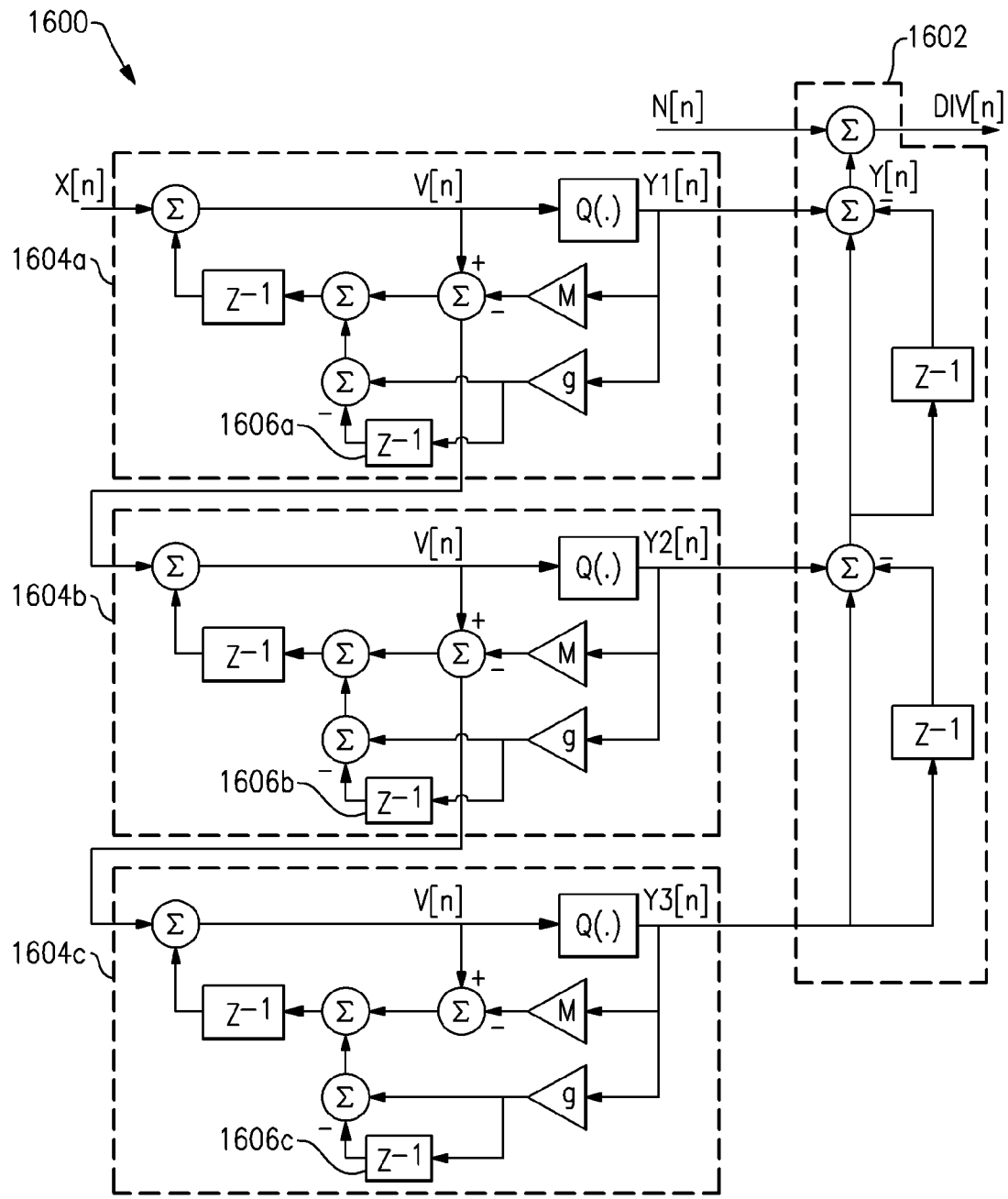
FIG. 16 illustrates an exemplary $3^{rd}$ order Dither-less Seed-less MASH architecture modulator (DS-MASH111) with approximately zero static error implemented with a 50% duty cycle, according to certain embodiments.

FIG. 16 illustrates an embodiment of a Dither-less Seedless MASH architecture modulator (DS-MASH111) 1600 with approximately zero static error. The DS-MASH111 comprises three cascaded $1^{st}$ order DS-EFM1 modulators 1604a, 1604b, 1604c, each comprising an additional feedback loop comprising a filter 1606a, 1606b, 1606c, respectively, configured to reduce the static error. The zero static error DS-MASH111 1600 further comprises a summing circuit 1602. The summing circuit 1602 is similar to the summing circuit 1302 in FIG. 13 and operates as described above with respect to the summing circuit 1302. The DS-EFM1 modulators 1604a, 1604b, 1604c operate similarly to the DS-EFM3 modulator 1500 in FIG. 15 as described above, taking into account that the DS-EFM1 modulators 1604a, 1604b, 1604c are first order modulators and the DS-EFM3 modulator 1500 is a third order modulator.

Referring to FIGS. 15 and 16, the filtering of the gain g averages out the error to approximately zero and forces the signal transfer function to approximately unity, providing approximately absolute zero static error. The effect of the periodic gain cancellation in both the zero static error DS-EFM3 1500 and the zero static error DS-MASH111 1600 modulators is mathematically shown:

Setting δ=0 in equations 11 and 22, the Signal Transfer Function and the Noise Transfer Function become, as described above:

$$STF = \frac{1}{M} \quad (12 \text{ \& } 23)$$

&

$$NTF = \frac{(1-Z^{-1})^3}{M}$$

For simplicity, if written in terms of clock cycles, equation 5 can be written as:

At cycle 1 ==> $M.y[n]-g.y[n-1]=x[n]-E[n-3]+3E[n-2]-3E[n-1]+E[n]$

At cycle 2 ==> $M.y[n-1]+g.y[n-2]=x[n-1]-E[n-4]+3E[n-3]-3E[n-2]+E[n-1]$ (24)

Add and then divide by 2 for the mean over two cycles in this example. The Z-transform representation is:

$$Y[z]=X[z]+E_q(z).(1-3Z^{-1}+3Z^{-2}-Z^{-3}) \quad (25)$$

The Signal and Noise Transfer Functions over the two cycles are then given by:

$$STF = \frac{1}{M} \quad (26)$$

&

$$NTF = (1-Z^{-1})^3$$

Equation 26 shows that the Signal Transfer Function is unity over time. This provides approximately zero static frequency error.

Embodiments of the Dither-less and Seed-less EFMs and MASHs with and without zero frequency error can be implemented on other high order loop modulators and hence are not restricted to $1^{st}$ order or $3^{rd}$ order modulators.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general-purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems that perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid-state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions, and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A dither-less delta-sigma modulator configured to generate a cyclic output code, the dither-less delta-sigma modulator comprising a feedback filtering network including a first feedback loop, a second feedback loop that includes a gain circuit configured to introduce a small error signal into the first feedback loop to disrupt tonal behavior due to the cyclic output code, and a third feedback loop that includes a filter electrical coupled to the gain circuit and configured to periodically cancel the small error signal in the second feedback loop to reduce static error.

2. The dither-less delta-sigma modulator of claim 1 further comprising a combining circuit electrically coupled to a quantizing circuit, and a summing circuit electrically coupled to the quantizing circuit and a second filter.

3. The dither-less delta-sigma modulator of claim 2 wherein the combining circuit is configured to combine an input signal and a modulator feedback signal to provide a summed signal.

4. The dither-less delta-sigma modulator of claim 3 wherein the quantizing circuit is configured to quantize the summed signal to generate the cyclic output code.

5. The dither-less delta-sigma modulator of claim 4 wherein the gain circuit is configured to receive the cyclic output code and provide a scaled output code.

6. The dither-less delta-sigma modulator of claim 5 wherein the filter is configured to receive the scaled output code and provide a filtered gain signal based on the scaled output code.

7. The dither-less delta-sigma modulator of claim 6 wherein the summing circuit is configured to combine the filtered gain signal, the scaled output code, the first summed signal, and the cyclic output code to provide the second summed signal.

8. The dither-less delta-sigma modulator of claim 7 wherein the second summed signal is filtered to provide the modulator feedback signal.

9. A phase-locked loop (PPL) circuit comprising:
a phase frequency detector (PFD) configured to generate a first signal representative of a phase difference between a reference signal and a PLL feedback signal;
an adjustment circuit in communication with the PFD and configured to generate a control voltage based on the first signal;
a voltage-controlled oscillator (VCO) in communication with the adjustment circuit and configured to generate an output signal based on the control voltage;
a divider circuit configured to receive the output signal and to generate an updated version of the PLL feedback signal; and
a dither-less delta-sigma modulator in communication with the divider circuit and including a feedback filtering network including a first feedback loop, a second feedback loop that includes a gain circuit configured to introduce a small error signal into the first feedback loop to disrupt tonal behavior due to a cyclic output code, and a third feedback loop that includes a first filter configured to periodically cancel the small error signal in the second feedback loop to reduce static error.

10. The PLL circuit of claim 9 wherein the first feedback loop includes a first summing circuit configured to provide a first summed signal based on an output of the divider circuit and a modulator feedback signal, a quantizing circuit configured to quantize the first summed signal to generate the cyclic output code, a second summing circuit configured to combine the first summed signal and the cyclic output code to provide a second summed signal, and a second filter configured to filter the second summed signal to provide the modulator feedback signal.

11. The PLL circuit of claim 10 wherein the gain circuit of the second feedback loop includes a gain component configured to receive the cyclic output code and to provide a scaled output code, the second summing circuit further configured to combine the scaled output code with the first summed signal and the cyclic output code to provide the second summed signal.

12. The PLL circuit of claim 11 wherein the first filter of the third feedback loop is configured to receive the scaled output code and to provide a filtered gain signal based on the scaled output code, the second summing circuit further configured to receive the filtered gain signal in order to average error in the modulator feedback signal so that the dither-less delta-sigma modulator provides approximately zero static error.

13. The PLL circuit of claim 12 wherein the first filter includes a delay element.

14. A wireless device comprising:
an antenna configured to facilitate reception of a radio frequency (RF) signal;
a receiver in communication with the antenna, the receiver configured to process the RF signal; and
a frequency synthesizer in communication with the receiver, the frequency synthesizer having a phase-locked loop (PLL) circuit having a divider circuit and a dither-less delta-sigma modulator in communication with the divider circuit and including a feedback filtering network including a first feedback loop and a second feedback loop that includes a gain circuit configured to introduce a small error signal into the first feedback loop to disrupt tonal behavior due to a cyclic output code, the first feedback loop including a first summing circuit configured to provide a first summed signal based on an output of the divider circuit and a modulator feedback signal, a quantizing circuit configured to quantize the first summed signal to generate a cyclic output code, a second summing circuit configured to combine the first summed signal and the cyclic output code to provide a second summed signal, which is filtered to provide the modulator feedback signal, the gain circuit of the second feedback loop including a gain component configured to receive the cyclic output code and to provide a scaled output code, the second summing circuit configured to combine the scaled output code with the first summed signal and the cyclic output code to provide the second summed signal.

15. The wireless device of claim 14 wherein the dither-less delta-sigma modulator further includes a third feedback loop that periodically cancels the gain from the scaled output code in the second feedback loop and that includes a filter configured to receive the scaled output code and to provide a filtered gain signal based on the scaled output code, the second summing circuit further configured to receive the filtered gain signal in order to average error in the modulator feedback signal so that the dither-less delta-sigma modulator provides approximately zero static error.

16. The wireless device of claim 15 wherein the filter includes a delay element.

17. A method to operate a phase-locked loop (PLL) circuit in a frequency synthesizer of a wireless device, the method comprising:
generating a first signal representative of a phase difference between a reference signal and a PLL feedback signal;
generating a control voltage based on the first signal;
generating an output signal based on the control voltage;
generating an updated version of the PLL feedback signal based on the output signal and a cyclic output code provided by a dither-less delta-sigma modulator including a modulator feedback loop that provides an updated version of the cyclic output code;
introducing a small error signal into the modulator feedback loop to disrupt tonal behavior due to the cyclic output code;
combining a divided signal that is generated based on the output signal and a modulator feedback signal to provide a first summed signal; and
quantizing the first summed signal to generate the cyclic output code.

18. The method of claim 17 further comprising scaling the cyclic output code.

19. The method of claim 18 further comprising combining the first summed signal, the cyclic output code, and the scaled cyclic output code to provide a second summed signal, the scaled cyclic output code providing the small error signal.

20. The method of claim 19 further comprising filtering the second summed signal to provide the modulator feedback signal.

21. The method of claim 20 further comprising filtering the scaled cyclic output code to provide a filtered gain signal and combining the first summed signal, the cyclic output code, the scaled cyclic output code, and the filtered gain signal to provide the second summed signal.

22. The method of claim 21 wherein the filtered gain signal periodically cancels gain from the cyclic output code to reduce static error.

* * * * *

UNITED STATES PATENT AND TRADEMARK OFFICE
CERTIFICATE OF CORRECTION

PATENT NO. : 9,231,606 B2  
APPLICATION NO. : 14/326822  
DATED : January 5, 2016  
INVENTOR(S) : Tom Taoufik Bourdi Page 1 of 1

It is certified that error appears in the above-identified patent and that said Letters Patent is hereby corrected as shown below:

Specification

In column 1 at line 22, Change "and or" to --and/or--.

In column 1 at line 47, Change "(PPL)" to --(PLL)--.

In column 2 at line 59, Change "(PPL)" to --(PLL)--.

In column 4 at line 4, Change "(PPL)" to --(PLL)--.

In column 10 at line 9, Change "and or" to --and/or--.

In column 14 at lines 3-5 (approx.), Change "$NTF = \frac{(1-Z^{-1})^3}{(1-\delta \cdot Z^{-1})}$" to --$NTF = \frac{(1-Z^{-1})^3}{(1-\delta \cdot Z^{-1})}$--.

In column 15 at line 25 (approx.), Change "$Y[z] = X[z] + E_q(z) \cdot (1 - 3Z^{-1} + 3Z^{-2} - Z^{-3})$" to --$Y[z] = X[z] + E_q(z) \cdot (1 - 3Z^{-1} + 3Z^{-2} - Z^{-3})$--.

Claims

In column 18 at line 22, In Claim 7, change "output code" to --code--.

In column 18 at line 26, In Claim 9, change "(PPL)" to --(PLL)--.

In column 19 at line 29, In Claim 14, change "signal, which" to --signal which--.

In column 19 at lines 30-31, In Claim 14, change "the gain circuit of the second feedback loop including again" to --the second feedback loop further including a gain--.

In column 19 at line 35, In Claim 14, change "signal and" to --signal, and--.

Signed and Sealed this  
Twenty-eighth Day of June, 2016

Michelle K. Lee  
*Director of the United States Patent and Trademark Office*